US011967643B2

(12) United States Patent
Kondo et al.

(10) Patent No.: US 11,967,643 B2
(45) Date of Patent: Apr. 23, 2024

(54) SEMICONDUCTOR DEVICE

(71) Applicant: SANKEN ELECTRIC CO., LTD., Niiza (JP)

(72) Inventors: Taro Kondo, Niiza (JP); Shunsuke Fukunaga, Saitama (JP); Bungo Tanaka, Soka (JP); Jun Yasuhara, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 271 days.

(21) Appl. No.: 17/479,223

(22) Filed: Sep. 20, 2021

(65) Prior Publication Data
US 2023/0088792 A1 Mar. 23, 2023

(51) Int. Cl.
*H01L 29/78* (2006.01)
*H01L 29/40* (2006.01)

(52) U.S. Cl.
CPC ........ *H01L 29/7813* (2013.01); *H01L 29/404* (2013.01); *H01L 29/407* (2013.01)

(58) Field of Classification Search
CPC . H01L 29/404; H01L 29/407; H01L 29/7813; H01L 29/66734
See application file for complete search history.

(56) References Cited

U.S. PATENT DOCUMENTS

| | | | |
|---|---|---|---|
| 2013/0062688 A1* | 3/2013 | Kobayashi | H01L 29/0878 257/330 |
| 2014/0284773 A1* | 9/2014 | Nishiguchi | H01L 29/402 438/597 |
| 2015/0137223 A1* | 5/2015 | Siemieniec | H01L 29/7813 257/331 |
| 2016/0268420 A1* | 9/2016 | Arai | H01L 29/41 |
| 2020/0373396 A1 | 11/2020 | Siemieniec et al. | |
| 2023/0078116 A1* | 3/2023 | Kobayashi | H01L 29/7803 257/331 |
| 2023/0087505 A1* | 3/2023 | Nishiwaki | H01L 29/7811 257/329 |

* cited by examiner

*Primary Examiner* — Joseph C. Nicely
(74) *Attorney, Agent, or Firm* — METROLEX IP LAW GROUP, PLLC

(57) ABSTRACT

A semiconductor is disclosed that may include: a first drift region; a base region arranged on the first semiconductor layer; a source region arranged on the base region; a main electrode electrically connected to the source region; and a gate electrode structure that penetrates the source region and base region and reaches the first drift region, wherein the gate electrode structure comprises: a gate electrode; and an insulating material that insulates the gate electrode from the first drift region and the base region; and a field plate structure reaching the first drift region deeper than the gate electrode structure, wherein the field plate structure comprises: a field plate; a resistive part that electrically connects the main electrode to the field plate; and an insulating material that insulates the field plate and the resistive part section from the first drift region and the base region.

17 Claims, 9 Drawing Sheets

SEMICONDUCTOR DEVICE

BACKGROUND

US2020-0373396 ("Siemieniec") discloses a semiconductor device that includes a semiconductor substrate 100 comprising a drift region 102 of a first conductivity type, a body region 104 of a second conductivity type formed above the drift region 102, and a source region 106 of the first conductivity type separated from the drift region 102 by the body region 104. The semiconductor device also includes stripe-shaped gate structures 112 formed in the semiconductor substrate 100 and separating adjacent rows of the spicular-shaped field plate structures 110. An interlayer dielectric 114 such as an oxide, nitride etc. insulates electrical connections to the stripe-shaped gate structures 112 from electrical connections to the stripe-shaped gate structures 112 from electrical connections to the spicular-shaped field plate structures 110, and a highly doped contact region 115 may be provided for electrically contacting the body region 104. As mentioned above, only part of one transistor cell is shown in FIGS. 1A and 1B of Siemieniec.

However, the resistance between the field plate and the source pad electrode ($R_{fp}$) of the semiconductor device disclosed in Siemieniec is small; therefore, when switching the semiconductor device from on to off, the semiconductor device becomes a hard recovery, which creates a problem that the switching noise of the semiconductor increases.

SUMMARY

A semiconductor device according to one or more embodiments may include: a first drift region of a first conductivity type; a base region of a second conductivity type arranged on the first semiconductor layer; a source region of the first conductivity type arranged on the base region; a main electrode electrically connected to the source region; and a gate structure that penetrates the source region and base region and reaches the first drift region, wherein the gate electrode structure comprises: a gate electrode; and an insulating material that insulates the gate electrode from the first drift region and the base region; and a field plate structure reaching the first drift region deeper than the gate electrode structure, wherein the field plate structure comprises: a field plate; a resistive part that electrically connects the main electrode to the field plate; and an insulating material that insulates the field plate and the resistive part section from the first drift region and the base region.

A semiconductor device according to one or more embodiments may include: a first drift region of a first conductivity type; a base region of a second conductivity type arranged on the first semiconductor layer; a source region of the first conductivity type arranged on the base region; a main electrode electrically connected to the source region; and a gate electrode structure that penetrates the source region and the base region and reaches the first drift region, wherein the gate electrode structure comprises: a first gate electrode; and an insulating material that insulates the gate electrode from the first drift region and the base region; and a field plate structure that reaches the first drift region deeper than the gate electrode structure, wherein the field plate structure comprises: a second gate electrode; a field plate arranged under the second gate electrode; a resistive part that electrically connects the main electrode to the second gate electrode; and an insulating material that insulates the field plate and the resistive part from the first drift region and base region.

DETAILED DESCRIPTION

Figure 1:
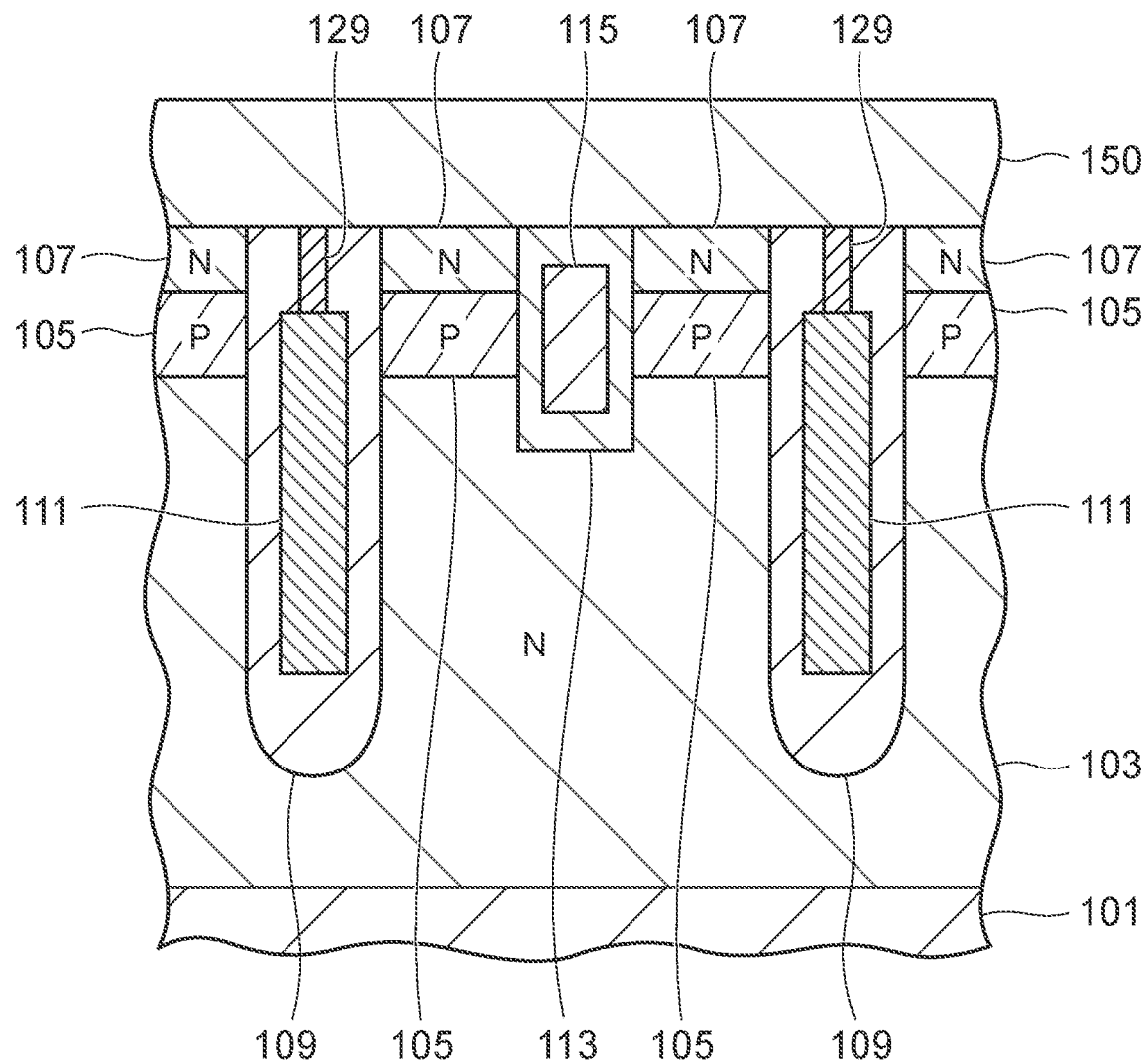
FIG. 1 is a diagram illustrating a cross-sectional view of a portion of a semiconductor device according to one or more embodiments.

One or more embodiments are described in detail with reference to drawings. In the following descriptions of drawings, the same or similar parts may be indicated by the same or similar indications. The descriptions of drawings are schematic, and the relationship between thickness and dimensions, the ratio of thickness of each layer, etc. are examples and do not limit the technical concept of the invention. The relationship between dimensions and the ratio of dimensions may differ from each other among the drawings. The following embodiments explains a condition where exemplary the first conductivity type is n-type and the second conductivity type is p-type, but it may be possible to select the conductivity types in the opposite relationship, where the first conductivity type is p-type and the second conductivity type is n-type. In the following descriptions when explaining the positional relationship of components, "top", "bottom", "right side", "left side", etc. are used as necessary based on an orientation of the referenced drawing, but these indications do not limit the technical concept of the invention. "Top", "bottom", "right side", "left side", etc. may be used without the parts touching each other. The X-axis, Y-axis, or Z-axis may be used in the drawings to explain directions. In diagrams, the "width direction" may mean the X direction or the direction opposite to the X direction in the figure. The "depth direction" or "lower side" may mean the Y direction illustrated in the figure. The "shallow direction" or "upper side" may mean the direction opposite to the Y direction illustrated in the figure. The "longitudinal direction" may mean the Z direction or the direction opposite to the Z direction illustrated in the figure.

FIG. 1 is a diagram illustrating a cross-sectional view of a portion of a semiconductor device according to one or more embodiments. This cross-sectional view illustrates, for example, a cross-sectional view of 1-1 in FIG. 2, which is described later. The semiconductor device includes a drain region 101; a drift region 103 provided on top of the drain region 101; a base region 105 provided on top of the drift region 103; a source region 107 provided on top of the base region 105; a main electrode 150 provided on top of the source region 107; a field plate structure 109 provided in contact with the drift region 103, the base region 105, and the source region 107, and is filled with an insulating material; a field plate 111 provided inside the field plate structure 109; a resistive part 129 provided to electrically connect the field plate 111 to the main electrode 150; a gate electrode structure 113 provided in contact with the drift region 103, the base region 105, and the source region 107; and a gate electrode 115 provided inside the gate electrode structure 113.

The drain region 101 may include a first conductive semiconductor; the drift region 103 may include the first conductive semiconductor. The source region 107 may include the first conductive semiconductor. The base region 105 may include a second conductive semiconductor. For example, the semiconductor device illustrated in FIG. 1 includes two field plate structures 109 and the gate electrode structure 113 provided between the two field plate structures 109. The gate electrode structure 113 includes the gate electrode 115, which is covered by an insulating material filled in the gate electrode structure 113. The field plate structure 109 is filled with an insulating material, and the field plate 111 is covered by the insulating material filled in the field plate structure 109. For example, as illustrated in FIG. 1, the field plate 111 may be positioned deeper than the gate electrode 115. The depth direction position of the gate electrode 115 may be positioned deeper than the depth direction position of the base region 105. The resistance value of the gate electrode 115 may be lower than that of the field plate 111.

The semiconductor device illustrated in FIG. 1 includes the field plate 111 provided inside the field plate structure 109 and the gate electrode 115 covered by an insulating material filled in the gate electrode structure 113. The main electrode 150, which is the source electrode, and the field plate 111 may be positioned not to have a low-resistance connection between them. As illustrated in FIG. 1, the resistive part 129 is provided between the main electrode 150 and the field plate 111. The width of the resistive part 129 where connects to the main electrode 150 or the field plate 111 may have the same width of the top surface of the field plate 111. The width of the resistive part 129 where connects to the main electrode 150 or the field plate 111 may also be smaller than that of the field plate 111. The width of the resistive part 129 where connects to the main electrode 150 or the field plate 111 may be 1/10, 1/9, 1/8, 1/7, 1/6, 1/5, 1/4, 1/3, 1/2, 2/3, 3/4, or etc. of the width of the field plate 111. The resistive part 129 may include a relatively high resistance material, such as polysilicon with a small impurity concentration. The resistance value of the resistive part 129 may be between 50 kΩ and 800 kΩ per field plate structure 109 and may be preferable between 58 kΩ and 254 kΩ. The sheet resistance may be about 25 Ω/sq. and may be preferably 29.7 Ω/sq. or more. The resistance value of the resistive part 129 may be adjusted by controlling the doping amount of impurities. The resistance value of the field plate 111 may be higher than the resistance value of the gate electrode 115. The main electrode 150 may be a material generally used in a semiconductor device and may include aluminum or an alloy of aluminum. A semiconductor device according to one or more embodiments may be able to reduce switching noise by soft recovery.

Figure 2:
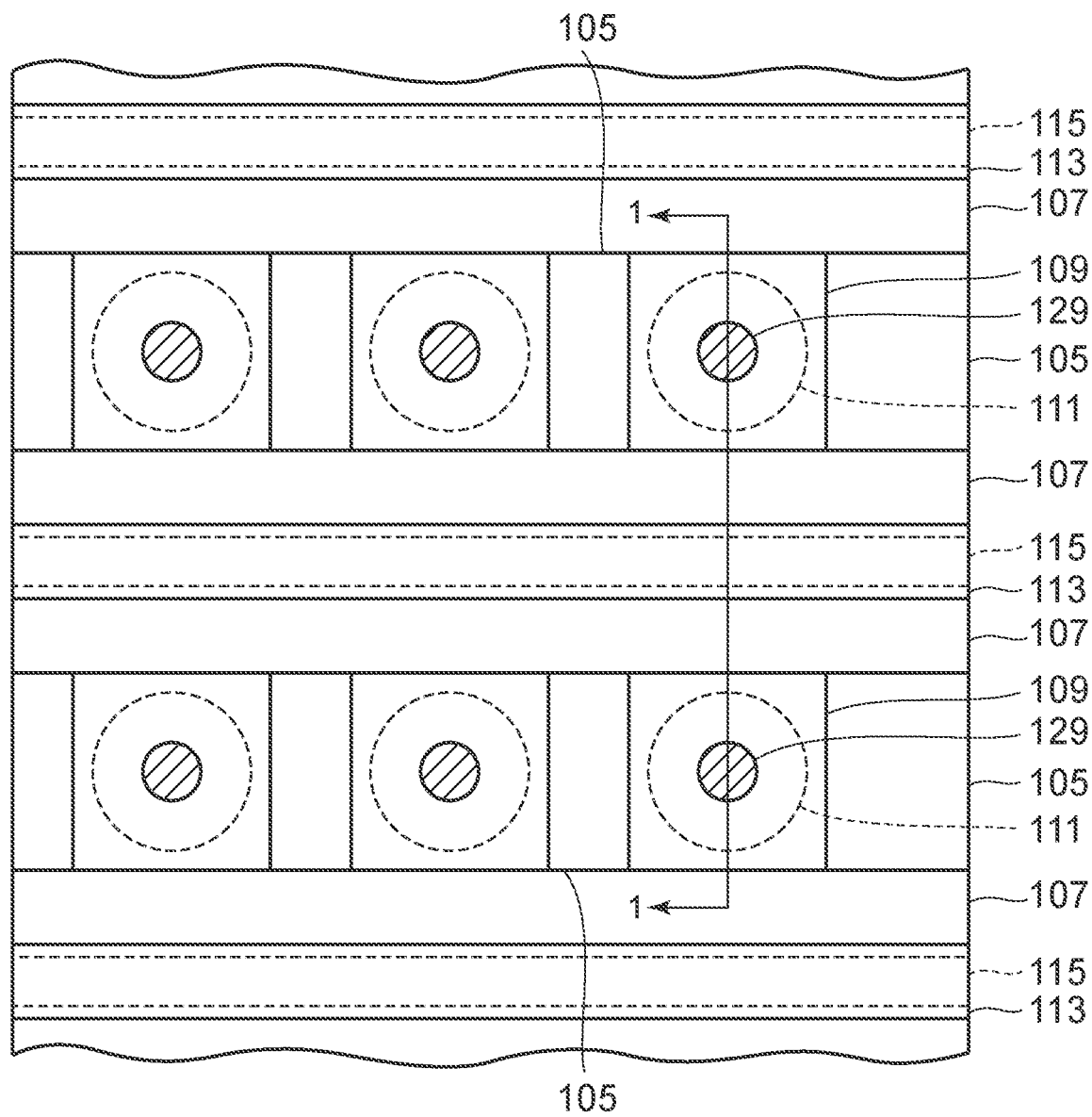
FIG. 2 is a diagram illustrating a plan view of the semiconductor device illustrated, such as in FIG. 1.
Figure 8:
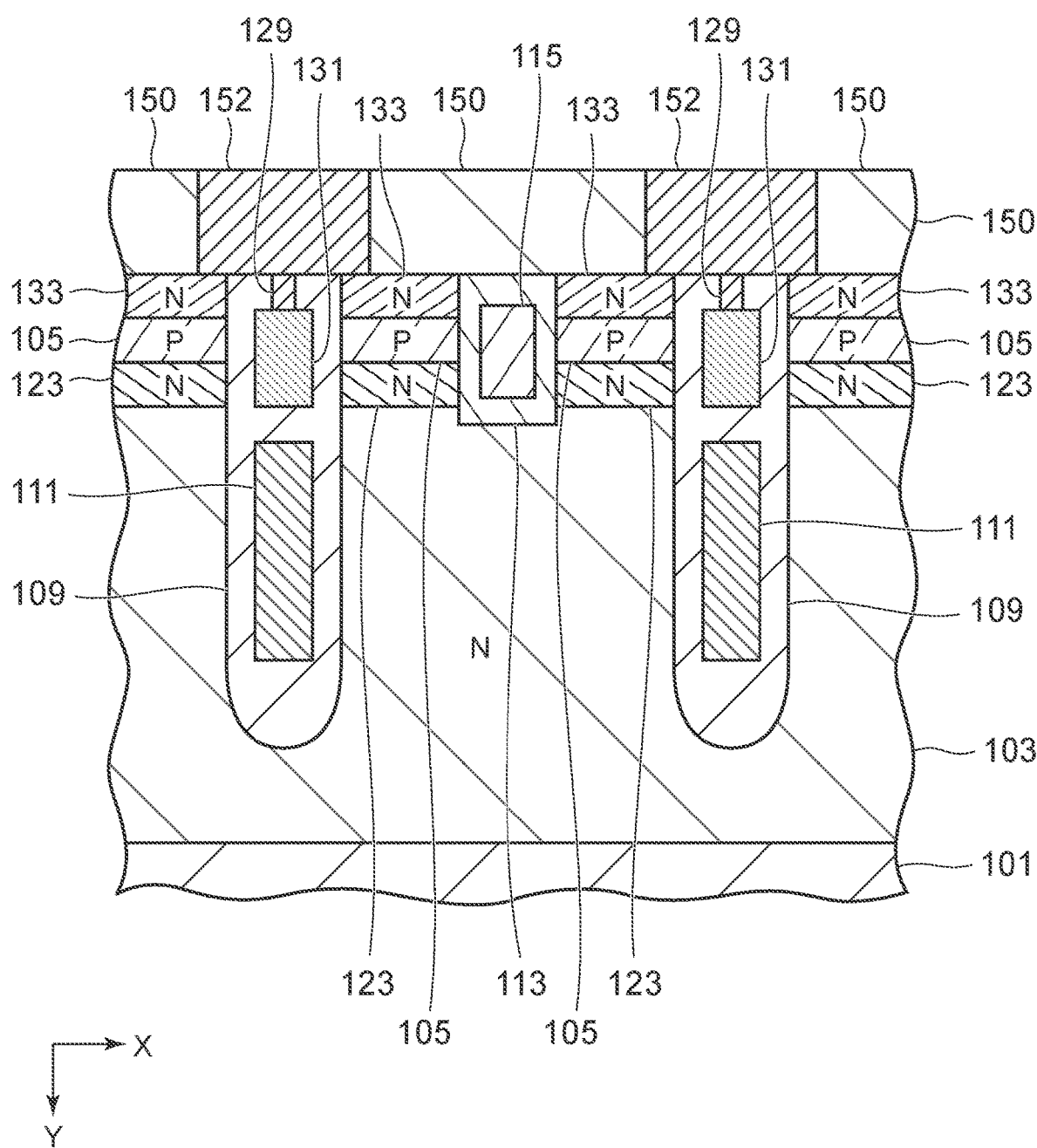
FIG. 8 is a diagram illustrating a cross-sectional view of a portion of a semiconductor device according to one or more embodiments.

FIG. 2 is a diagram illustrating a plan view of the semiconductor device illustrated in FIG. 1, for example. For explanatory convenience, the main electrode 150 in FIG. 1 is omitted. The semiconductor device illustrated in FIG. 2 includes field plate structures 109. Each field plate structure 109 includes the resistive part 129 connected to the main electrode 150 (omitted in FIG. 2) and the field plate 111 electrically connected to the resistive part 129. Each field plate structure 109 is in contact with the source region 107. The source regions 107 are provided to sandwich the field plate structures 109, and each source region 107 is provided to be in contact with trenches in the longitudinal direction (Z direction). Since there is no source region 107 in between adjacent field plate structures 109 in the Z direction, a base region 105 is provided. The gate electrode structure 113 is provided between the source regions 107. The gate electrode 115 is provided inside the gate electrode structure 113, and the gate electrode 115 is insulated from the source region 107 by an insulating material filled in the gate electrode structure 113. As illustrated in FIG. 8, the main electrode 150 on the field plate structure 109 may be replaced with a resistive part 152, and the main electrode 150 and the resistive part 152 may be electrically connected. Also, the bus line connecting the multiple field plates 111 in the Z direction is provided to connect the resistive part 152 on the field plate structure 109 and may be narrower than the width of the gate electrode structure 113 including the gate electrode (X direction). The resistance value of the field plate 111 may be higher than the resistance value of the gate electrode 115. The doping amount of the conductivity determining impurities injected into the field plate 111 may be lowered to increase the resistance value of the field plate 111. The field plate 111 is insulated from the outside of the field plate structure 109 by an insulating material inside the field plate structure 109.

FIG. 2 illustrates six field plate structures 109 for explanatory convenience. It is not limited to this, however, and more field plate structures 109 may be provided in the longitudinal direction (Z direction) or the width direction (X direction). FIG. 2 illustrates four source regions for explanatory convenience. It is not limited to this, however, and more source regions 107 may be provided in the longitudinal direction (Z direction) or the width direction (X direction). FIG. 2 also illustrates three gate electrode structures 113 for explanatory convenience. It is not limited to this, however, and more gate electrode structures 113 may be provided in the longitudinal direction (Z direction) or the width direction (X direction).

Figure 3:
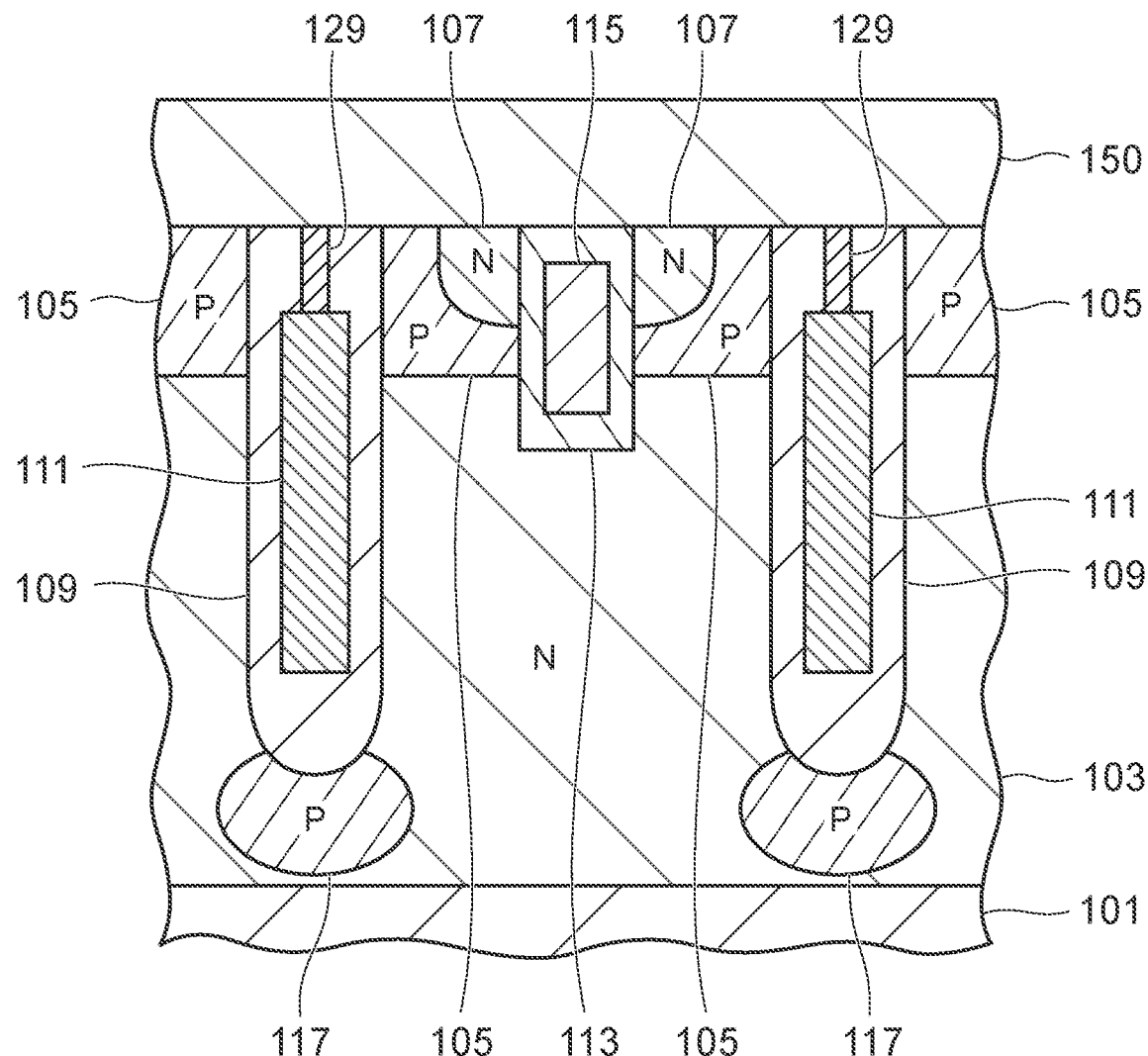
FIG. 3 is a diagram illustrating a cross-sectional view of a portion of a semiconductor device according to one or more embodiments.

FIG. 3 is a diagram illustrating a cross-sectional view of a portion of a semiconductor device according to one or more embodiments. This semiconductor device includes the drain region 101; the drift region 103 provided on top of the drain region 101; the base region 105 provided on top of the drift region 103; the source region 107, the main electrode 150 provided on top of the source region 107; the field plate structure 109 provided in contact with the drift region 103, the base region 105, and the source region 107, and is filled with an insulating material; the field plate 111 provided inside the field plate structure 109; the resistive part 129 provided to electrically connect the field plate 111 to the main electrode 150; the gate electrode structure 113 provided in contact with the drift region 103, the base region 105, and the source region 107; the gate electrode 115 provided inside the gate electrode structure 113; and a second conductivity type embedded region 117 provided in contact with the bottom of the field plate structure 109 and positioned deeper than the field plate structure 109. For example, in the semiconductor device illustrated in FIG. 3, the source region 107 contacts the gate electrode structure 113, the base region 105, and the main electrode 150. The source region 107 is not in contact with the field plate structure 109. A semiconductor device according to one or more embodiments may be able to mitigate an electric field at the bottom of the field plate structure 109 including the field plate 111 that is prone to cause electric field concentration. Even if the second conductivity type embedded region 117 is provided at the bottom of the field plate structure 109, it may be able to suppress an increase in the ON-resistance of the semiconductor device because the current path of the semiconductor device is less affected. Other components may be the same as in the aforementioned embodiments; therefore their descriptions are omitted.

Figure 4:
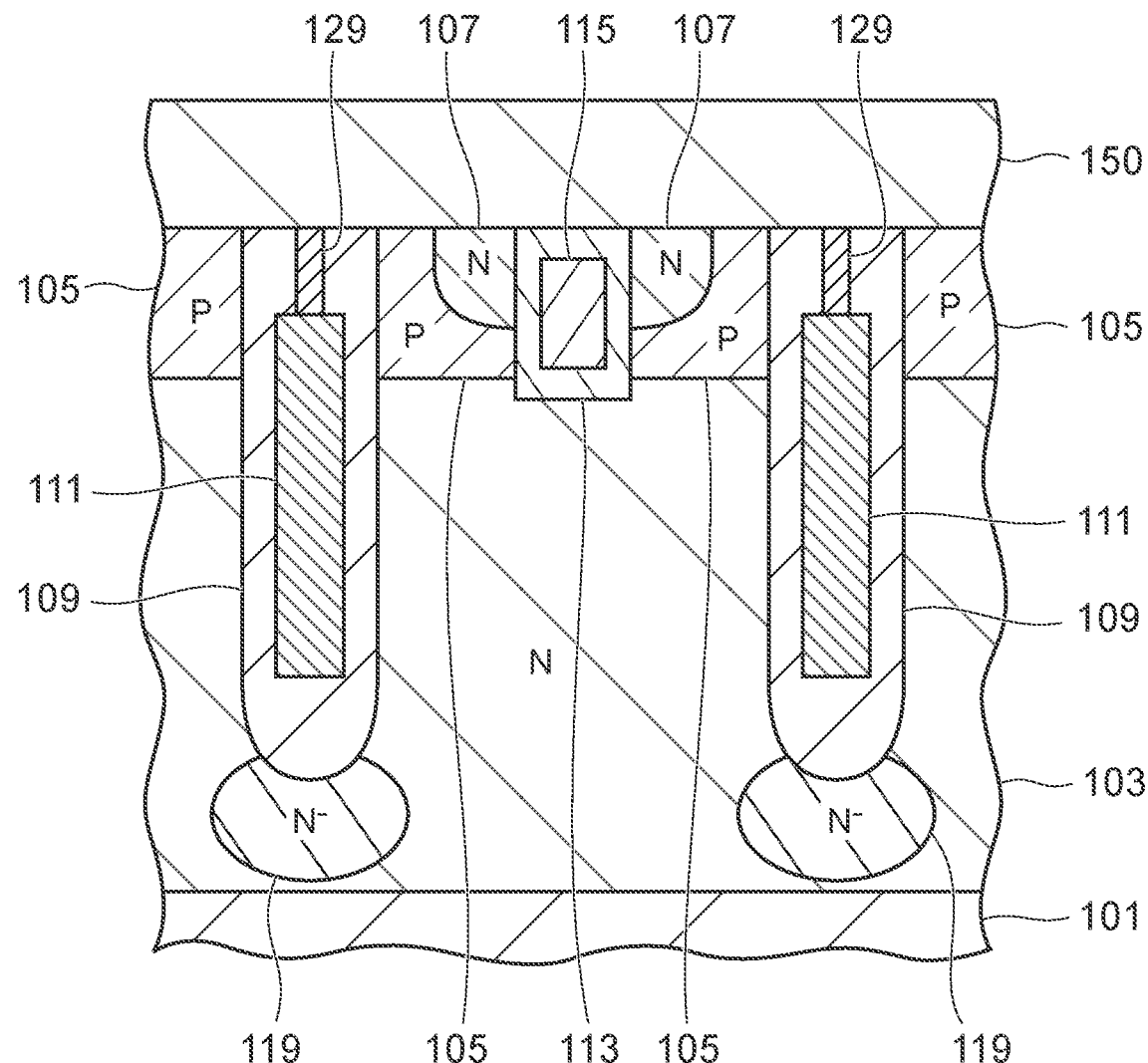
FIG. 4 is a diagram illustrating a cross-sectional view of a portion of a semiconductor device according to one or more embodiments.

FIG. 4 is a diagram illustrating a cross-sectional view of a portion of a semiconductor device according to one or more embodiments. The semiconductor device illustrated in FIG. 4 includes a first conductivity type embedded region 119 that is connected to the field plate structure 109 and located deeper than the field plate structure 109. The first conductivity type embedded region 119 may include a first conductive semiconductor with an impurity concentration that is relatively lower than the impurity concentration of the drift region 103 around the first conductivity type embedded region 119. A semiconductor device according to one or more embodiments may be able to mitigate the electric field at the bottom of the field plate structure 109 including the field plate 111 that is prone to cause electric field concentration. Even if the first conductivity type embedded region 119 is provided at the bottom of the field plate structure 109, it may be able to suppress an increase in the ON-resistance of the semiconductor device because the current path of the semiconductor device is less affected. Other components may be the same as in the aforementioned embodiments; therefore, their descriptions are omitted.

Figure 5:
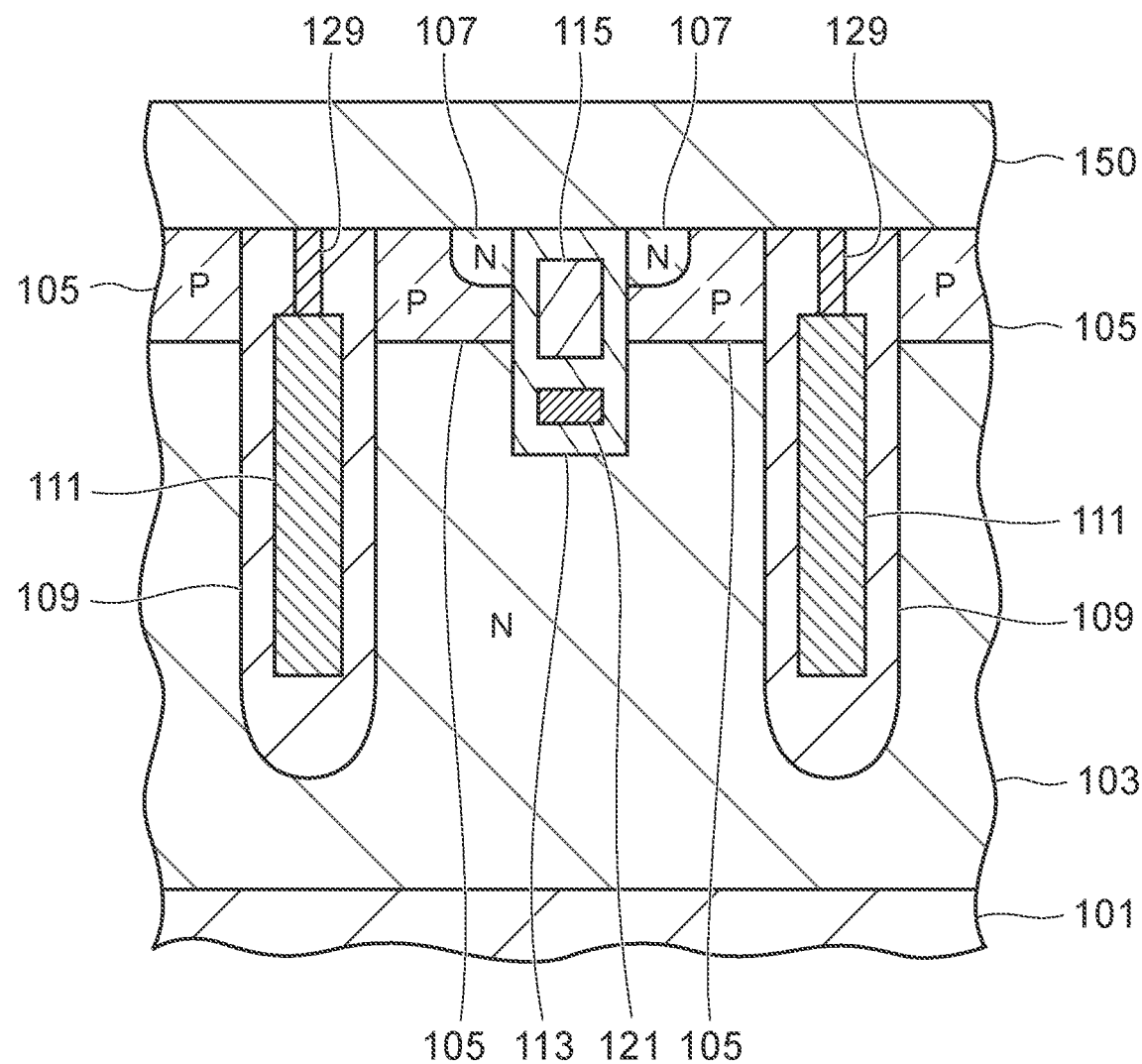
FIG. 5 is a diagram illustrating a cross-sectional view of a portion of a semiconductor device according to one or more embodiments.

FIG. 5 is a diagram illustrating a cross-sectional view of a portion of a semiconductor device according to one or more embodiments. The semiconductor device illustrated in FIG. 5 includes the gate electrode structure 113 provided in contact with the drift region 103, the base region 105, and the source region 107, and the gate electrode structure 113 includes the gate electrode 115 and a field plate 121. For example, in the gate electrode structure 113 illustrated in FIG. 5, the gate electrode 115 is provided in a shallow position, and the field plate 121 is provided in a deep position. The field plate 121 is electrically connected to the floating potential or the main electrode 150. This arrangement may reduce the increase in the electrical field capacity between the gate and the drain. Other components may be the same as those of the aforementioned embodiments; therefore, their descriptions are omitted.

Figure 6:
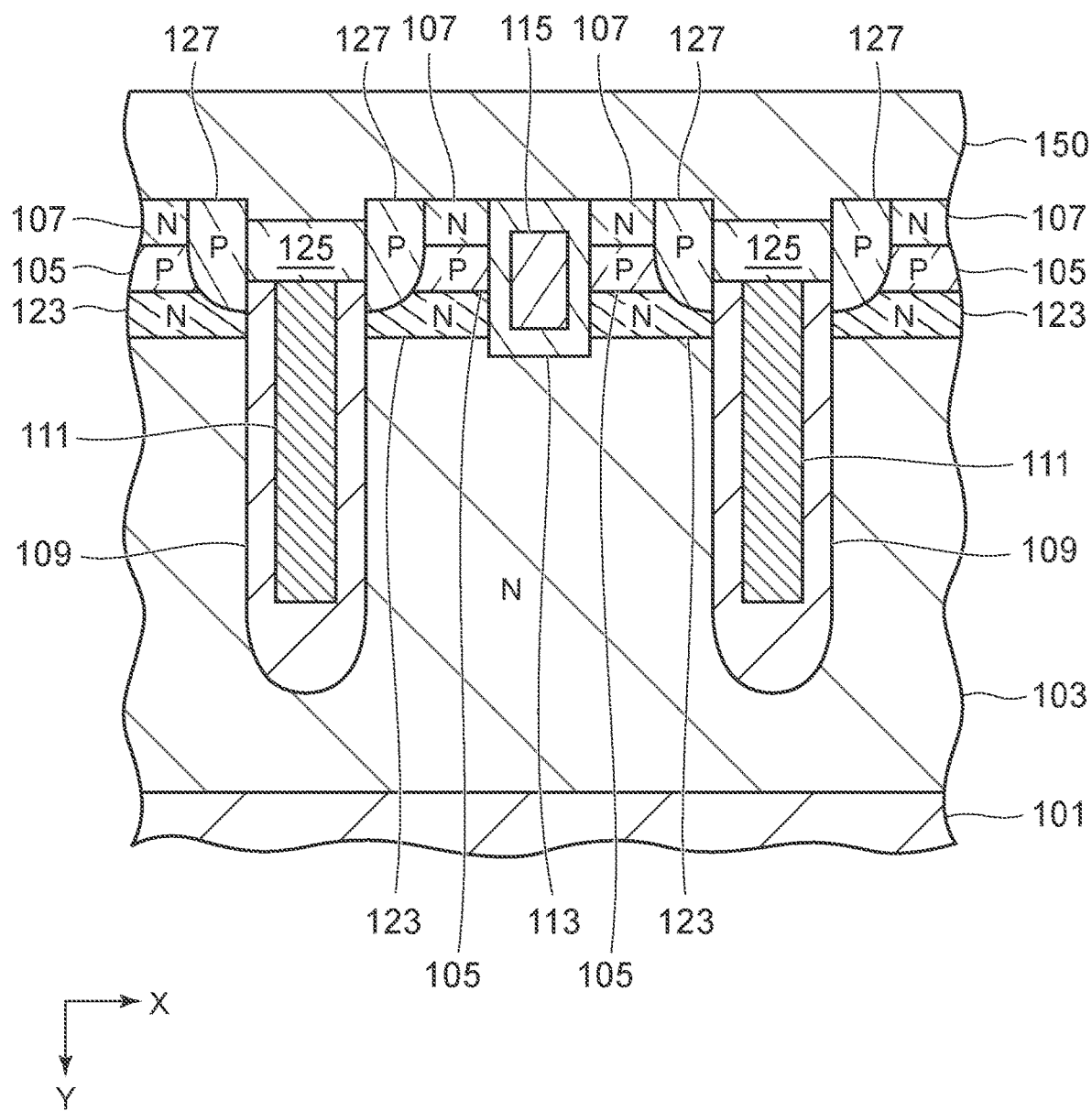
FIG. 6 is a diagram illustrating a cross-sectional view of a portion of a semiconductor device according to one or more embodiments.

FIG. 6 is a diagram illustrating a cross-sectional view of a portion of a semiconductor device according to one or more embodiments. The semiconductor device illustrated in FIG. 6 includes the drain region 101; the drift region 103 provided on top of the drain region 101; a drift region 123 provided on top of the drift region 103; the base region 105 provided on top of a fourth semiconductor region; the source region 107 provided on top of the base region 105; the main electrode 150 provided on top of the source region 107; the field plate structure 109 provided in contact with the drift region 103, the base region 105, and the source region 107, and filled with an insulating material inside; the field plate 111 provided inside the field plate structure 109; a resistive layer 125 provided to electrically connect the field plate 111 to the main electrode 150; the gate electrode structure 113 provided in contact with the drift region 103, the base region 105, and the source region 107; and the gate electrode 115 provided inside the gate electrode structure 113. For example, the semiconductor device illustrated in FIG. 6 includes a portion of the main electrode 150 inside the field plate structure 109. The resistive layer 125 covers the entire width direction of the field plate structure 109 and electrically connects the main electrode 150 to the field plate 111. The top of the trench of the field plate 111 is filled only with the resistive layer 125 and may not include any insulating material. Second conductivity type regions 127 are placed on both sides of the width direction of the field plate structure 109. The second conductivity type region 127 is in contact with the field plate structure 109, the resistive layer 125, the drift region 123, the base region 105, the source region 107, and the main electrode 150. The second conductivity type region 127 may extend from a position in contact with the main electrode 150 to a position deeper than the base region 105. The second conductivity type region 127 may include a second conductive semiconductor and may have a higher impurity concentration than the base region 105. The resistive layer 125 may include a relatively high resistance material, such as polysilicon with a small impurity concentration. The resistance value of the resistive layer 125 may be between 50 kΩ and 800 kΩ per field plate structure 109 and may be preferable between 58 kΩ and 254 kΩ. The sheet resistance may be about 25 Ω/sq. and may be preferably 29.7 Ω/sq. or more. The resistance value of the resistance layer 125 may be adjusted by controlling the doping amount of impurities. The drift region 123 may have a higher concentration of impurities of the first conductivity type than that of the drift region 103.

The semiconductor device illustrated in FIG. 6 may improve the avalanche breakdown voltage. Other components may be the same as in the aforementioned embodiment; therefore, their descriptions are omitted.

Figure 7:
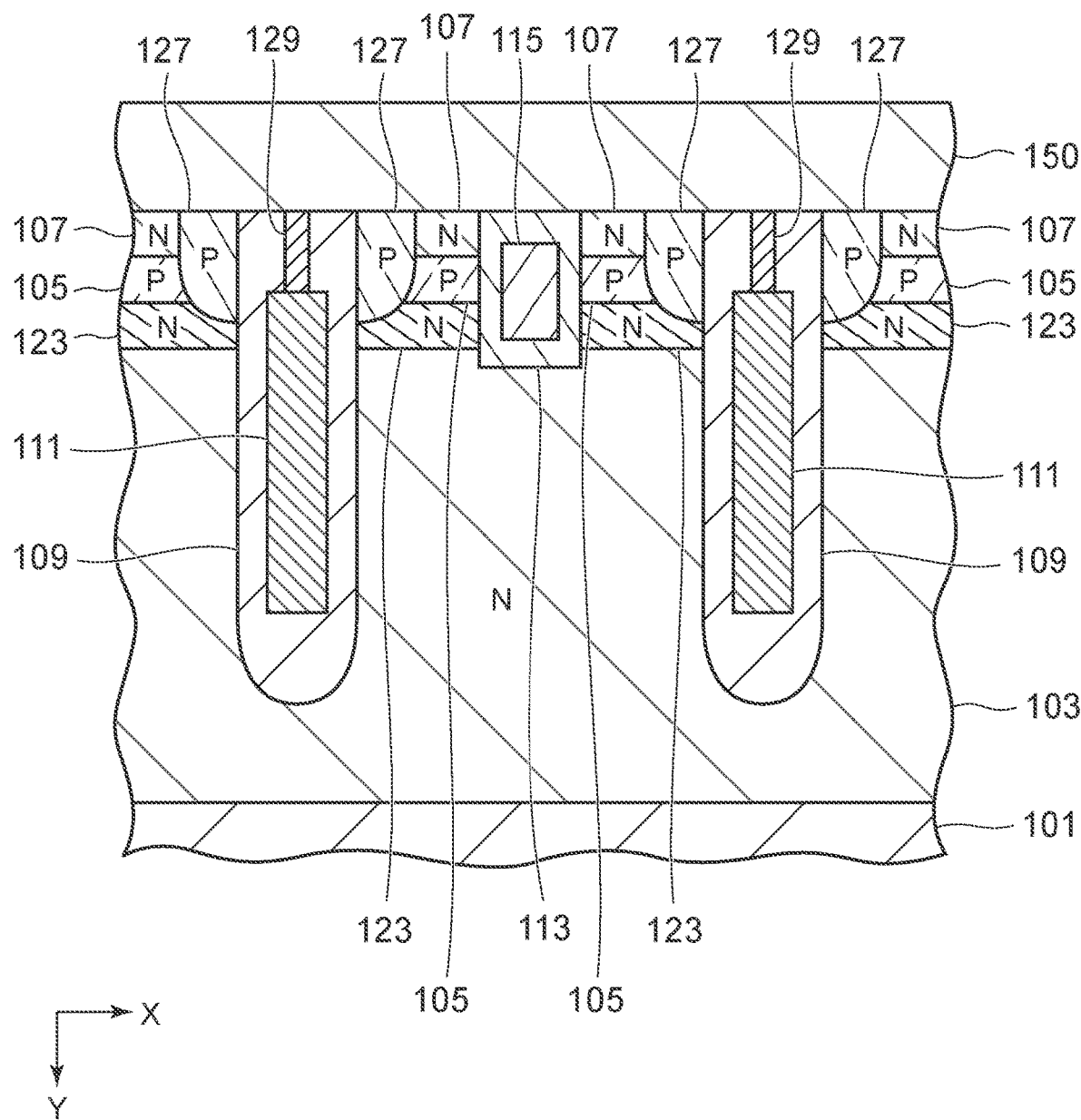
FIG. 7 is a diagram illustrating a cross-sectional view of a portion of a semiconductor device according to one or more embodiments.

FIG. 7 is a diagram illustrating a cross-sectional view of a portion of a semiconductor device according to one or more embodiments. The semiconductor device illustrated in FIG. 7 includes the resistive part 129 provided between the main electrode 150 and the field plate 111. The width of the resistive part 129 where connects to the main electrode 150 or the field plate 111 may be the same width of the field plate. The resistive part 129 faces the second conductivity type region 127 with an insulating material, and the width of the resistive part 129 where connects to the main electrode 150 or the field plate 111 may be smaller than that of the field plate. Other components may be the same as those of the aforementioned embodiments; therefore, their descriptions are omitted.

FIG. 8 is a diagram illustrating a cross-sectional view of a portion of a semiconductor device according to one or more embodiments. This cross-sectional view illustrates, for example, a cross-sectional view of 8-8 in FIG. 9, which is described later. In the semiconductor device illustrated in FIG. 8, the field plate structure 109 is filled with an insulating material inside and includes the first field plate 111, a second gate electrode 131, the resistive part 129 that electrically connects the second gate electrode 131 to the main electrode 150, and a resistive part 152 on the resistive part 129. The second gate electrode 131 is provided at the top of the first field plate 111. In the semiconductor device illustrated in FIG. 8, the resistive part 152 is provided on the semiconductor device and contacts a source region 133, the field plate structure 109, and the resistive part 129. The resistive part 152 is alternately provided with the main electrode 150 on the semiconductor device in the X direction and is electrically connected to the main electrode 150. The resistive part 152 may be made of the same material as the resistive part 129. The resistance value of the resistive part 152 may be between 50 kΩ and 800 kΩ per field plate structure 109 and may be preferable between 58 kΩ and 254 kΩ. The sheet resistance may be about 25 Ω/sq and may be preferably 29.7 Ω/sq. or more.

Figure 9:
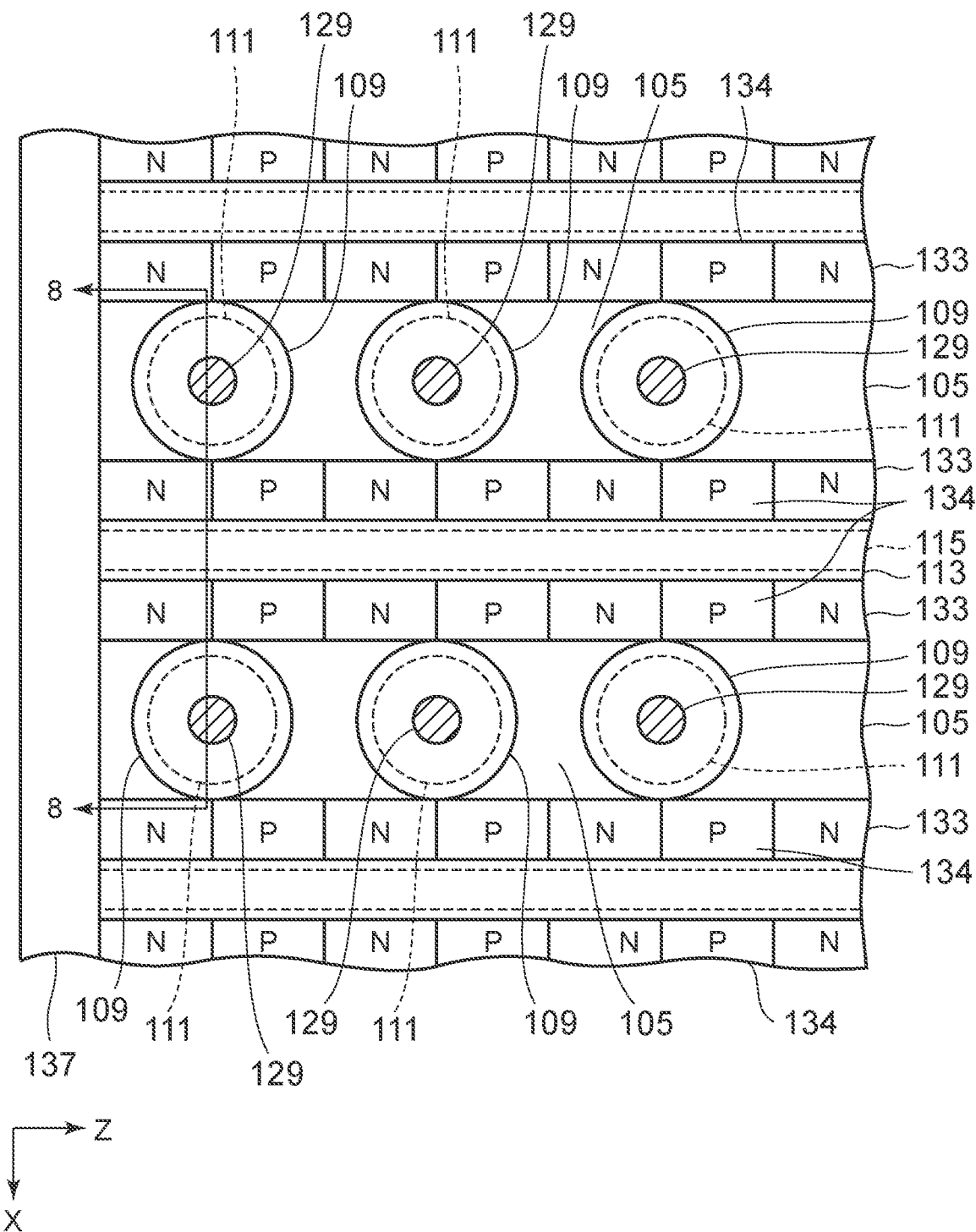
FIG. 9 is a diagram illustrating a plan view of the semiconductor device illustrated, such as in FIG. 8.

FIG. 9 is a diagram illustrating a plan view of the semiconductor device illustrated in FIG. 8. FIG. 8 illustrates the 8-8 cross section in FIG. 9. For explanatory convenience, the main electrode 150 and the resistive part 152 in FIG. 8 are omitted. As illustrated in FIG. 9, for example, the semiconductor device includes field plate structures 109. Each field plate structure 109 includes the resistive part 129 connected to the resistive part 152 (omitted in the figure) and the field plate 111 electrically connected to the resistive part 129. Each field plate structure 109 is in contact with the source region 133 and a second conductivity type contact region 134. The source regions 133 are provided to sandwich field plate structures 109, and each source region 133 is provided to be in contact with trenches in the longitudinal direction (Z direction). Since there is no source region 107 in between adjacent field plate structures 109 in the Z direction, a base region 105 is provided. In the semiconductor device illustrated in FIG. 9, in order to make the thickness of the insulating material equal, the field plate 111 and the field plate structure 109 are in a circular shape when viewed from a flat surface. For example, in order to make the thickness of the insulating material equal, the planar shapes of the field plate structure 109 and the field plate 111 may be made into concentric circles. The source region 133 and the second conductivity type contact region 134, which is electrically connected to the base region 105, are alternately provided on the semiconductor surface along the gate electrode structure 113 extending in the Z direction. In the semiconductor device illustrated in FIG. 9, the source region 133 or the second conductivity type contact region 134 is formed in contact with the field plate structure 109. The dimension in the Z direction of the source region 133 may be wider than the dimension in the Z direction of the second conductivity type contact region 134. The dimension in the Z direction of the source region 133 may be narrower than the dimension in the Z direction of the second conductivity type contact region 134.

The gate electrode structure 113 is provided to be sandwiched between the source regions 133. The gate electrode 115 is provided inside the gate electrode structure 113, and the gate electrode 115 is insulated from the source region 107 by the gate electrode structure 113. The width of the bus line connecting the field plates 111 (the width of the resistive part 152 (X direction) in FIG. 8) may be narrower than the width of the gate electrode structure 113 including the gate electrode 115 (X direction). The resistance value of the field plate 111 may be higher than the resistance value of the gate electrode 115. The doping amount of the conductivity determining impurities injected into the filed plate 111 may be lowered to increase the resistance value of the filed plate 111. The field plate 111 is insulated from the outside of the field plate structure 109 by an insulating material inside the field plate structure 109.

A field plate connection wiring 137 electrically connects the main electrode 150 and the adjacent resistive part 152 in the X direction. In FIG. 9, the field plate connection wiring 137 is a single wire, but it is not limited thereto. For example, the field plate connection wiring 137 may also be provided at the end of the semiconductor device illustrated in FIG. 9 in the Z direction.

As explained above, according to one or more semiconductor devices, by controlling the resistance from the field plate to the upper electrode, hard recovery may be avoided when switching the semiconductor device from on to off. This may reduce the switching noise when switching the semiconductor device. reduce the switching noise when switching the semiconductor device.

One or more embodiments described above may be applicable to semiconductor devices including power semiconductors such as MOSFET (Metal Oxide Semiconductor Field Effect Transistor) and IGBT (Insulate Gate Bipolar Transistor).

Although one or more embodiments as described above herein may be directed to devices having a particular arrangement of layers with conductivity types, e.g. N, N+, P, and so on, other embodiments may be directed to devices in which the conductivity types are reversed or otherwise modified. Furthermore, the above-described aspects may be combined with each other as practicable within the contemplated scope of embodiments. The above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

The invention claimed is:

1. A semiconductor device comprising:
 a first drift region of a first conductivity type;
 a base region of a second conductivity type arranged on the first drift region;
 a source region of the first conductivity type arranged on the base region;
 a main electrode electrically connected to the source region; and
 a gate electrode structure that penetrates the source region and base region and reaches the first drift region, wherein:
 the gate electrode structure comprises:
  a gate electrode;
  an insulating material that insulates the gate electrode from the first drift region and the base region;
 the semiconductor device further comprises a plurality of field plate structures reaching the first drift region deeper than the gate electrode structure, each of the plurality of field plate structures comprising:
  a field plate;
  a resistive part that electrically connects the main electrode to the field plate; and
  an insulating material that insulates the field plate and the resistive part from the first drift region; and
  in plan view, field plate structures of the plurality of field plate structures are arranged in a plane in one of: a first direction or a second direction of the semiconductor device, such that no source region is between adjacent ones of the plurality of field plate structures in the one of the first direction or the second direction.

2. The semiconductor device according to claim 1, wherein the resistive part is narrower than the field plate.

3. The semiconductor device according to claim 1, wherein the resistive part contains a higher resistance value than that of the field plate.

4. The semiconductor device according to claim 1, wherein
the resistive part comprises polysilicon.

5. The semiconductor device according to claim 1, wherein
a resistance of the gate electrode is lower than that of the field plate.

6. The semiconductor device according to claim 1, wherein
the source region is positioned in contact with the gate electrode structure and not with any of the plurality of field plate structures.

7. The semiconductor device according to claim 1, further comprising:
an embedded region of the second conductivity type in contact with a bottom of each of the plurality of field plate structures.

8. The semiconductor device according to claim 1, further comprising:
an embedded region of the first conductivity type which is in contact with a bottom of each of the plurality of field plate structures, and an impurity concentration in the embedded region of the first conductivity type is lower than an impurity concentration in the first drift region of the first conductivity type.

9. The semiconductor device according to claim 1, wherein the field plate is arranged under the gate electrode.

10. The semiconductor device according to claim 1, further comprising:
a second drift region of the first conductivity type arranged between the first drift region and the base region, an impurity concentration of the second drift region is higher than that of the first drift region.

11. The semiconductor device according to claim 10, further comprising:
a second conductivity type region arranged in contact with at least one of the plurality of field plate structures and not with the gate electrode structure.

12. The semiconductor device according to claim 11, wherein;
the second conductivity type region extends deeper than the base region and has a higher impurity concentration than that of the base region.

13. The semiconductor device according to claim 10, wherein
the source region is arranged in contact with the gate electrode structure and not with any of the plurality of field plate structures.

14. The semiconductor device according to claim 10, wherein
the resistive part is arranged to cover an entire width direction of the respective field plate structure.

15. The semiconductor device according to claim 10, wherein
the resistive part is narrower than a width of the field plate.

16. The semiconductor device according to claim 1, wherein the at least one of the first direction or the second direction comprises a longitudinal direction of the gate trench structure such that the plurality of field plate structures is arranged in the plane in the longitudinal direction, and no source region is provided in a region between adjacent ones of the plurality of field plate structures.

17. A semiconductor device comprising:
a first drift region of a first conductivity type;
a base region of a second conductivity type arranged on the first drift region;
a source region of the first conductivity type arranged on the base region;
a main electrode electrically connected to the source region; and
a gate electrode structure that penetrates the source region and base region and reaches the first drift region, wherein:
the gate electrode structure comprises:
a gate electrode; and
an insulating material that insulates the gate electrode from the first drift region and the base region;
a field plate structure reaching the first drift region deeper than the gate electrode structure, and comprising:
a field plate;
a resistive part that electrically connects the main electrode to the field plate; and
an insulating material that insulates the field plate and the resistive part from the first drift region; and
a resistance of the gate electrode is lower than that of the field plate.

* * * * *